(12) United States Patent
Lin et al.

(10) Patent No.: US 6,489,436 B1
(45) Date of Patent: Dec. 3, 2002

(54) POLYIMIDE COPOLYMER AND METAL LAMINATE USING THE SAME

(75) Inventors: Jenq-Tain Lin, Kitaibaraki (JP); Hiroyuki Sekine, Kitaibaraki (JP); Alexandre L'vovich Rusanov, Moscow (RU); Lyubov Borisovna Elchina, Moscow Region (RU); Calina Valentinovna Kazakova, Moscow (RU); Yakov Semionovich Vygodskii, Moscow (RU)

(73) Assignee: Nippon Mektron, Limited, Tokyo (JP)

(*) Notice: Subject to any disclaimer, the term of this patent is extended or adjusted under 35 U.S.C. 154(b) by 0 days.

(21) Appl. No.: 09/980,237

(22) PCT Filed: Oct. 11, 2000

(86) PCT No.: PCT/JP00/07046

§ 371 (c)(1),
(2), (4) Date: Nov. 29, 2001

(87) PCT Pub. No.: WO01/29136

PCT Pub. Date: Apr. 26, 2001

(30) Foreign Application Priority Data

Oct. 18, 1999 (JP) .............................. 11-294691

(51) Int. Cl.$^7$ ..................... C08G 73/10; C08G 69/20; B32B 27/00
(52) U.S. Cl. ................ 528/353; 428/457; 428/458; 428/473.5; 428/411.1; 528/125; 528/126; 528/128; 528/172; 528/173; 528/176; 528/179; 528/183; 528/188; 528/220; 528/229; 528/350; 528/351

(58) Field of Search ................. 528/125, 126, 528/128, 172, 173, 176, 179, 183, 188, 220, 229, 350, 351, 353; 428/457, 458, 473.5, 411.1

(56) References Cited

U.S. PATENT DOCUMENTS

| | | | | |
|---|---|---|---|---|
| 3,247,165 A | * | 4/1966 | Rodici | 528/353 |
| 5,290,909 A | | 3/1994 | Chen et al. | 528/353 |
| 6,133,408 A | * | 10/2000 | Chiu et al. | 528/353 |
| 6,355,357 B1 | * | 3/2002 | Takahashi et al. | 428/473.5 |

FOREIGN PATENT DOCUMENTS

| | | |
|---|---|---|
| JP | 45-1832 | 1/1970 |
| JP | 6-104542 | 4/1994 |

* cited by examiner

*Primary Examiner*—P. Hampton-Hightower
(74) *Attorney, Agent, or Firm*—Baker & Daniels

(57) ABSTRACT

Novel polyimide copolymer, which is a copolymer of isopropylidene-bis-(4-phenyleneoxy-4-phthalic acid) dianhydride and 6-amino-2-(p-aminophenyl)benzimidazole or a copolymer of two kinds of tetracarboxylic acid dianhydrides consisting of isopropylidene-bis-(4-phenyleneoxy-4-phthalic acid)dianhydride and 3,3',4,4'-benxophenonetetracarboxylic acid dianhydride and 6-amino-2-(p-aminophenyl)benzimidazole, can form a metal laminate by direct lamination with metallic foils. The metal laminate can fully satisfy the peel strength.

11 Claims, No Drawings

POLYIMIDE COPOLYMER AND METAL LAMINATE USING THE SAME

TECHNICAL FIELD

The present invention relates to a novel polyimide copolymer and a metal laminate using the same and more particularly to a novel polyimide copolymer effective for use preferably in bonding with metallic foils and a metal laminate using the same.

BACKGROUND ART

Heretofore, metal laminates such as flexible wiring boards, etc. have been prepared by bonding metallic foils such as copper foils, etc. to aromatic polyimide films, using an adhesive of epoxy resin, urethane resin, etc. However, flexible wiring boards prepared by using such an adhesive have suffered from various problems due to the adhesive used, such as peeling of the adhesive layer due to high temperatures in the soldering step or use in high temperature circumstances, smear generation in the drilling step, etc.

To overcome such problems, it would be better to conduct direct lamination of aromatic polyimide and metallic foils without use of the adhesive layer, but the peel strength of the most of the resulting metal laminates has not been satisfied yet.

DISCLOSURE OF THE INVENTION

An object of the present invention is to provide an aromatic polyimide capable of forming a metal laminate by direct lamination with metallic foils and fully satisfy the peel strength of metal laminates thus formed.

Such an object of the present invention can be attained by a novel polyimide, which is a copolymer of isopropylidene-bis-(4-phenyleneoxy-4-phthalic acid)dianhydride and 6-amino-2-(p-aminophenyl)benzimidazole or a copolymer of two kinds of tetracarboxylic acid dianhydrides consisting of isopropylidene-bis-(4-phenyleneoxy-4-phthalic acid) dianhydride and 3,3',4,4'-benzophenonetetracarboxylic acid dianhydride and 6-amino2-(p-aminophenyl)benzimidazole.

For the tetracarboxylic acid dianhydrides of the present novel polyimide copolymers, isopropylidene-bis(4-henyleneoxy4-phthalic acid)dianhydride:

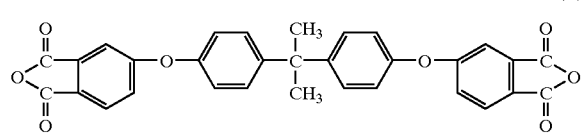

(A)

or a mixture thereof with 3,3',4,4'-benzophenonetetracarboxylic acid dianhydride:

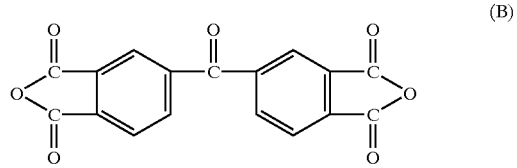

(B)

can be used

When component (A) and component (B) are used together, component (B) is used m a proportion of not more than about 90 mol. %, preferably not more than about 80 mol. % to tie mixture thereof with component (A). When component (B) is used in a higher proportion, the proportion of component (A) will be correspondingly not more than about 10 mol. %, and the solubility of the resulting polyimide copolymer in an organic solvent will be lowered For diamine that reacts with these tetracarboxylic acid dianhydrides, 6-amino-2-(p-aminophenyl)benzidazole can be used.

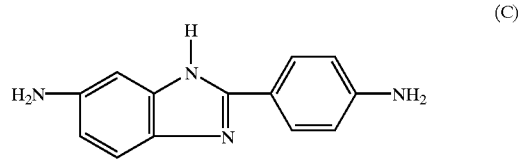

(C)

Reaction of tetracarboxylic acid dianhydride with diamine is carried out even in an aprotic polar solvent such as dimethylformamide, dimethylacetamide, N-methyl-2-pyrrolidone, etc., but preferably in a polar solvent such as m-cresol, etc. Practically, a solution of diamine in a polar solvent is dropwise added to a solution of tetracarboxylic acid dianhydride in a polar solvent with stirring while keeping a temperature at about 0°–about 60° C., and after the dropwise addition reaction is carried out with stirring at a temperature of about 0°–about 60° C. for about 0.5–about 5 hours. It seems that polyamic acid is formed by the reaction. To complete polyimidization reaction by dehydrating cyclization reaction, heating to about 100°–about 250° C., preferably about 150°–about 200° C., is carried out with stirring for about 2–about 8 hours in the latter half stage of reaction. A catalyst such as benzoic acid, etc. is added to the solution of tetracarboxylic acid dianhydride and used for the reaction.

The reaction m is poured into an insoluble organic solvent such as methanol, etc. to obtain white polyimide copolymer The resulting copolymer has a glass transition temperature (Tg) of about 250°–about 330° C. and $\eta_{red}$ (N-methyl-2-pyrrolidone) of about 0.2–about 3.0 dl. When the copolymer is applied to lamination of metallic foils, the reaction mixture in a solution state can be directly applied to lamination of metallic foils without such separation of polyimide copolymer from the solution of polyimide copolymer as the reaction mixture.

By reaction of tetracarboxylic acid dianhydride (A) with diane (C), a polyimide copolymer with the following repeat units can be obtained:

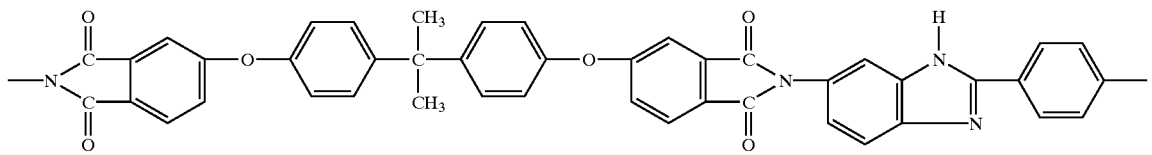

When tetracarboxylic acid dianhydride (A) is used together with (B), a polyimide copolymer with the following repeat units in addition to the above-mentioned repeat units can be obtained by reaction with diamine (C):

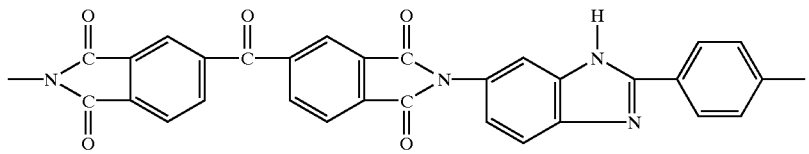

Preparation of metal laminate using such a novel polyimide copolymer can be carried out by applying a solution of polyimide copolymer to a metallic foil, typically a copper foil by casting, etc., followed by heating in two stages, ie. a temperature of about 60°–about 200° C., preferably about 80°–120° C., and another temperature of about: 150°–about 200° C., each for about 5–about 60 minutes, thereby forming a polyimide copolymer layer having a film thickness of about 3–about 75 μm, i.e. forming a metal laminate with the metallic foil at one side of the copolymer layer. Another metallic foil is laid on the other side of the copolymer layer, followed by passing through and between laminate rolls heated to a temperature of about 150°–about 400° C., preferably about 200°–350° C. with processing, thereby easily bonding the metallic foil directed specially to the transfer to the copolymer layer, i.e. forming a two-side laminate such as copper-lined material etc.

BEST MODE FOR CARRYING OUT THE INVENTION

The present invention will be described below, referring to Examples.

EXAMPLE 1

A solution containing 26 g (0.05 moles) of isopropylidene-bis-(4-phenyleneoxy-4-phthalic acid) dianhydride, 16.1 g (0.05 moles) of 3,3',4,4'-benzophenonetetracarboxylic acid dianhydride and 12.2 g of benzoic acid dissolved in 500 ml of m-cresol was charged into a 4-necked flask having a capacity of 1 liter and a stirrer, and 22.4 g (0.1 mole) of 6-amino-2-p-aminophenyl) benzimidazole was added thereto while keeping a temperature at not more than 30° C., followed by sting at room temperature for one hour, thereby obtaining a polyamic acid solution. The solution as such was heated up to 200° C. and stirring was continued at that temperature for 5 hours. The reaction mixture was poured into 500 ml of methanol and the precipitates were recovered by filtering and dried, whereby 61 g of polyimide copolymer was obtained.

The polyimide copolymer thus obtained had Tg=308° C. and η$_{red}$ (N-methyl-2-pyrrolidone)=1.20 dl and was soluble in dimethylformamide, dimethylacetamide, N-methyl-2-pyrrolidone and m-cresol.

A 15 wt. % solution of the polyimide copolymer in N-methyl-2-pyrrolidone was applied to a copper foil (thickness: 18 μm) by casting, and the application layer was heated at 80° C. for 30 minutes and then at 180° C. for 30 minutes to form a lamination sheet having a thickness of 25 μm on the copper foil By aging at 260° C. for 2 hours, a one-side laminate with no curling was obtained. Then, another copper foil (thickness: 18 μm) was laid on the other side of the lamination sheet, followed by passing through and between laminate rolls heated to 330° C. while pressing, thereby conducting pressure bonding to obtain a two-side laminate.

The resulting laminate of copper foil/polyimide copolymer/copper foil was subjected to determination of peel strength according to JIS C-6481, and found to be 2.1 kg/cm under room temperature conditions and 1.4 kg/cm under heating conditions of 150° C. Furthermore, when soldering heat resistance thereof was observed under conditions of 300° C. for one minute, no swelling of polyimide copolymer layer was found.

EXAMPLE 2

In Example 1, no 3,3',4,4'-benzophenonetetracarboxylic acid dianhydride was used, while the amount of isopropylidene-bis-(4phenyleneoxy-4phthalic acid) dianhydride was changed to 52 g (0.1 mole). 71 g of polyimide copolymer was obtained.

The resulting polyimide copolymer had Tg=275° C. and η$_{red}$ (N-methyl-2-pyrrolidone)=1.20 dl and was soluble in dimethylformamide, dimethylacetamide, N-methyl-2-pyrrolidone, phenol and m-cresol.

A laminate of copper foil (18 μm)/polyimide copolymer (25 μm)/copper foil (18 μm) was prepared, using a 15 wt. % solution of the polyimide copolymer in N-methyl-2-pyrrolidone in the same manner as in Example 1, and the peel strength of the laminate was determined and found to be 1.8 kg/cm under room temperature conditions and 1.6 kg/cm under heating conditions of 300° C. for one hour. No swelling was found in the soldering heat resistance test.

COMPARATIVE EXAMPLE

In Example 1, no isopropylidene-bis-(4phenyleneoxy-4phthalic acid) dianhydride was used, but the amount of 3,3',4,4'-benzophenonetetracarboxylic acid dianhydride was changed to 32.2 g (1.0 mole). 50 g of polyimide copolymer was obtained.

The resulting polyimide copolymer had Tg=390° C. and was insoluble in dimethylformamide, dimethylacetamide, N-methyl-2-pyrrolidone and m-cresol That is, neither solution nor laminate with copper foils could be formed.

INDUSTRIAL APPLICABILITY

The present novel polyimide copolymer per se has a high bonding strength and can give a metal laminate satisfying the peel strength even if bonded to a metallic foil without any adhesive layer as an intermediate. Furthermore, the distinguished soldering heat resistance enables the metal laminate to serve as a flexible metal foil-lined laminate board in suitable use for flexible wiring board, etc. without curling.

What is claimed is:

1. A novel polyimide copolymer, which comprises a copolymer of isopropylidene-bis-(4-phenyleneoxy4-phthahic acid)dianhydide and 6-amino-2-(p-aminophenyl) benzimidazole.

2. A novel polyimide copolymer, which comprises a copolymer of two kinds of tetracarboxylic add dianhydrides consisting of isopropylidene-bis-(4-phenyleneoxy-4-phthalic acid)dianhydride and 3,3',4,4'-benzophenonetetracarboxylic acid dianhydride, and 6-amino-2-p-aminophenyl)benzimidazole.

3. A process for preparing a novel polyimide copolymer, which comprises reacting isoproylidene-bis-(4phenyleneoxy-4phthalic acid)dianhydride or two kinds of tetracarboxylic add dianhydrides consisting of isopropylidene bis-(4-phenyleneoxy-4-phthalic acid)dianhydride and 3,3',4,4'-benzophenonetetracarboxylic acid dianhydride, with 6-amino-2-(p-aminophenyl)-benzimidazole in a polar solvent, thereby forming a polyamic acid, followed by conducting dehydrating cyclization reaction.

4. A process for preparing a novel polyimide copolymer according to claim 3, wherein the polar solvent is m-cresol.

5. A process for preparing a novel polyimide copolymer according to claim 3, wherein the reaction is carried out in the presence of a benzoic acid catalyst.

6. A novel polyimide copolymer according to claim 1 for use bonding to a metallic foil.

7. A novel polyimide copolymer according to claim 2 for use in bonding to a metallic foil.

8. A metal laminate with a metallic foil laid on one side of a layer of polyimide copolymer according to claim 1.

9. A metal laminate with a metallic foil laid on one side of a layer of polyimide copolymer according to claim 2.

10. A metal laminate with metallic foils laid on both sides of a layer of polyimide copolymer according to claim 1, respectively.

11. A metal laminate with metallic foils laid on both sides of a layer of polyimide copolymer according to claim 2, respectively.

* * * * *